United States Patent [19]

Audebert et al.

[11] Patent Number: 5,073,931
[45] Date of Patent: Dec. 17, 1991

[54] SYSTEM AND INDIVIDUAL DEVICE FOR PARTICIPATION IN A BROADCAST PROGRAM

[75] Inventors: Yves Audebert, Croissy-sur-Seine; Achille Delahaye, Fontenay-sous-Bois, both of France

[73] Assignee: Audebert-Delahaye-Venture, Issy-les-Moulineaux, France

[21] Appl. No.: 524,890

[22] Filed: May 18, 1990

[30] Foreign Application Priority Data

May 25, 1989 [FR] France ............................ 89 06848
Feb. 9, 1990 [FR] France ............................ 90 01512

[51] Int. Cl.$^5$ ............................................ H04K 1/00
[52] U.S. Cl. .................................... 380/23; 380/25; 273/148 B; 340/825.31
[58] Field of Search ................ 380/3, 5, 23, 24, 25, 380/49; 455/2, 5; 358/84, 85, 142; 340/825.31, 825.34; 273/148 B

[56] References Cited

U.S. PATENT DOCUMENTS

| | | |
|---|---|---|
| 4,592,546 | 6/1986 | Pascenda . |
| 4,745,468 | 5/1988 | Von Kohorn . |
| 4,747,050 | 5/1988 | Brachtl et al. .................... 380/24 X |
| 4,750,036 | 6/1988 | Martinez ........................ 358/142 X |
| 4,799,061 | 1/1989 | Abraham et al. ................. 380/23 X |
| 4,885,778 | 12/1989 | Weiss ............................. 380/23 X |
| 4,910,775 | 3/1990 | Yves et al. ......................... 380/25 |
| 4,944,008 | 7/1990 | Piosenka et al. ................. 380/23 X |

FOREIGN PATENT DOCUMENTS

A-8607277 12/1986 World Int. Prop. O. .

Primary Examiner—Thomas H. Tarcza
Assistant Examiner—Tod Swann
Attorney, Agent, or Firm—Armstrong, Nikaido, Marmelstein, Kubovcik & Murray

[57] ABSTRACT

This device allows an individual to participate in a television program as a function of remotely loaded data. It includes a device for reception of date (R), a keyboard (8), a clock (10) and a device for processing data entered at the keyboard as a function of the remotely loaded data and for producing a result which is a function of the processing. A device for certification is coupled to the clock (10) in order to measure the elapsed time between a characteristic instant of the running of a scenario in the device (1) and the establishment of a certification link with a server (S). A certified result is supplied by a device for comparison when there is equality, to within a given tolerance, between the measured time and a reference time computed by the server.

28 Claims, 7 Drawing Sheets

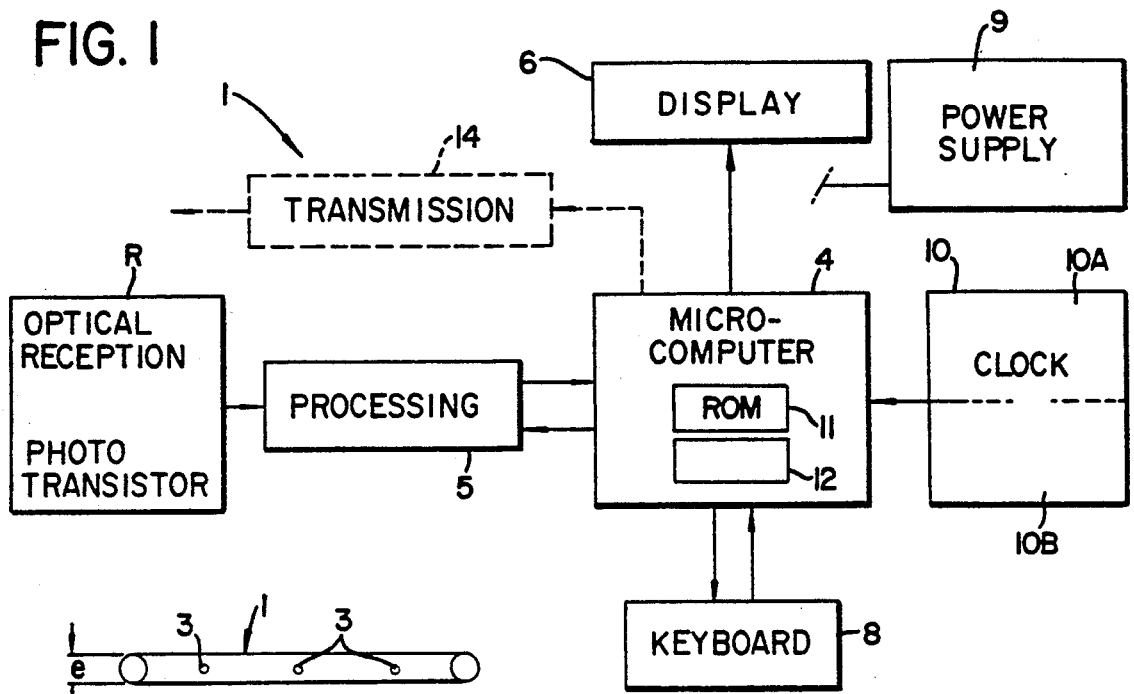
FIG. 1
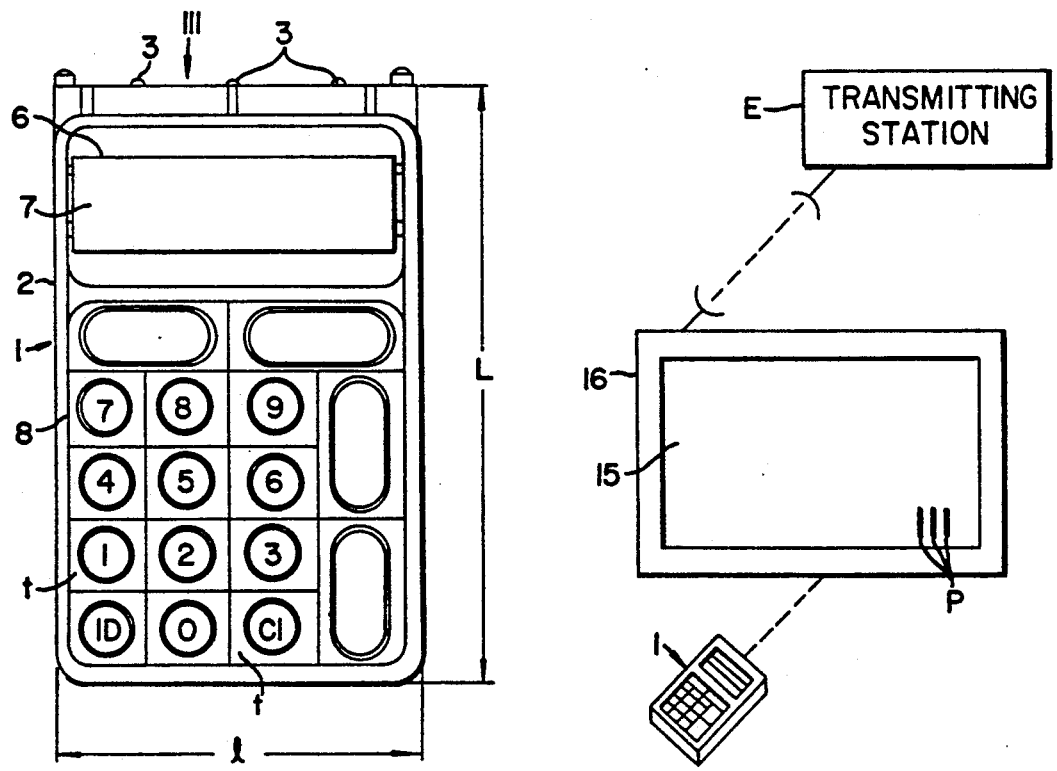
FIG. 3
FIG. 2
FIG. 4

SYSTEM AND INDIVIDUAL DEVICE FOR PARTICIPATION IN A BROADCAST PROGRAM

FIELD OF THE INVENTION

The invention relates to an electronic device intended to allow at least one individual, on the one hand, to participate from a receiving set in a televised program and, on the other hand, to certify the participation in association with a server. The invention also relates to a system allowing individuals to participate in a televised program by means of such an electronic device.

BACKGROUND OF THE INVENTION

The U.S. Pat No. 4,745,468 describes a system which allows an evaluation of the answers given by listeners or viewers to questions asked during a radio or television program. The station which broadcasts the program simultaneously transmits, on another radio broadcast channel, an instructions signal containing data representing the question which must be answered, the time lapse provided for formulating an answer and the content and form of the correct answer. The data is loaded remotely in consoles which are provided to the individuals desiring to participate in the broadcast program. For this purpose the consoles comprise a specific means of receiving the instructions signal.

Each console comprises means of timing which compel the participant to formulate an answer within the provided period, this answer being entered into the console by means of a keyboard. In the console, processing means compare the participant's answer with the correct remotely loaded answer, compute the result, winnings or score obtained by the participant and cumulate it with the previously accumulated score.

The cumulated score can then transferred, possibly in encoded form, onto a recording medium for magnetic readout (card with magnetic track) or optical readout (printed or punched sheet). This recording medium thus allows the user of the console to prove participation in the broadcast program and, in association with a server, to validate the obtained result. In exchange, the participant will possibly be able to be awarded a prize in the form of money, an award, a reduction on goods or services, etc. . .

However, this system, as described in the U.S. Pat. No. 4,745,648, has a serious omission in that it does not prevent an individual from recording the broadcast program and the abovementioned instruction signal on a video tape recorder and/or an audio tape recorder, from learning the correct answers to the questions asked, from participating in the program at a later time by means of the recording made, and from then validating the score fraudulently obtained.

The U.S. Pat. No. 4,592,546 describes a similar system allowing viewers to make a bet on the result of an event, such as a football match, before its broadcast by a television station.

In order to bet, the viewers have a console provided with a receiver allowing it to receive radioelectric signals transmitted by a central station. The console is fitted with a real time clock synchronized with an absolute time scale in to order to determine, in the console, the precise time at which the viewer makes a bet. The deadline for betting (kickoff time for a football match for example) is transmitted from the central station to the consoles by radioelectric means and the console only takes account of the bet made by the viewer if this bet is made before the deadline.

For purposes of verification, the console is also provided with 10 counters which are triggered at random times by signals transmitted from the central station. When a player wishes to validate the winnings, the player puts the console into communication with the central station by means of a telephone line and the result is only validated if the state of the counters in the console is at that instant identical with that of similar counters in the central station, whose counting is started at the moment of transmission of the abovementioned signals.

According to this U.S. Pat. No. 4,592,546, the taking into account of the bet fundamentally depends upon the allocation to the latter of a very accurate absolute time by the clock fitted to the console. This clock must therefore be of very high precision (quartz of the type used in clocks for example) as the total drift of this clock over the entire lifetime of the console must not exceed a very low maximum value. The clocks are relatively expensive. The use of clocks with lower performance, and therefore less expensive, combined with a special procedure for adjusting the time of the clock by an authorized organization could be envisaged, but such a system would be a source of difficulties (risks of fraud, dispute, etc. . . ).

Furthermore, the verification procedure aims at avoiding the fraud which would consist in preventing the reception by a console of the real deadline and in allowing a deferred bet by means of a falsification of this deadline. The verification procedure is not truly satisfactory as it is also based on the transmission to the consoles, during the running of the program, of external signals: such a transmission always risks technical difficulties and disputes in the case of defective operation.

SUMMARY OF THE INVENTION

The invention intends to provide an electronic device allowing an individual to participate in a broadcast program (wired or wireless transmission) received on a television or radio receiver, a remote data or data processing terminal, or any other set for receiving a program, by introducing in its device at least one participation datum which can be, for example, an answer to a question asked during the broadcast program, a bet on an event to come, a random or pseudo-random code as part of a lottery game or similar, etc. . . Furthermore, while being of low cost allowing its large scale distribution, i.e. without necessitating an accurate real time clock synchronized with an absolute time scale, this device must be capable, in association with a server, of certifying that the participation datum has been correctly entered in the device before a given absolute deadline.

Another object of the invention is to provide a device which is independent, i.e. having its own electrical power supply source and consequently having a low electrical consumption, and which does not necessitate a permanent association with a server while its user is participating in a broadcast program.

It is also desirable that such a device should be portable and of reduced size, while being provided with ergonomic means of data input and data output in order to facilitate the entry of participation data, the certification of the participation in association with a server and, if necessary, the remote loading of a scenario. A scenario comprises all of the parameters which, as a function of the broadcast program, determine in the device the conditions of participation in this program.

Another object of the invention is that such a device provides a high degree of protection against fraud.

In order to achieve these o iects, as well as others, a subject of the invention is an dividual and independent electronic device for participation according to a stored scenario in a broadcast program and for certification of the participation in association with a server, in which:

the device comprises at least:

interface device for the entry by a participant of at least one datum representative of the participation in the program and the establishment of a certification link with the server, a device for storing the participation datum and the scenario, a clock, and a device for measuring the relative time $\delta T_{int}$ elapsed between at least a first event of the scenario chronologically correlated with the entry of a participation datum in the device and the establishment of the certification link with the server, the server comprises at least a device for measuring the relative time $\delta T_{ref}$ elapsed between at least a second event of the program chronologically correlated with an absolute deadline for the entry of the participation datum and the establishment of the certification link, and the device and/or the server comprises or comprise a device for comparing the relative times measured in the device and the server and of certifying or not certifying the participation as a function of the result of the comparison.

With this device, the time logging of the participation in a program does not depend on the transmission to the device of external signals during the running of the program. The measurement of time in the device is in fact triggered by an event of the scenario which takes place within the latter. The time logging takes place a posteriori, i.e. at the moment when the user establishes a certification link with the server. It is therefore possible to participate in the program in real time, but also in deferred time. However, in the latter case, the participation will not be certified because the time $\delta T_{int}$ measured in the device will not be consistent with the reference $\delta T_{ref}$ measured by the server.

This device does not necessitate a high accuracy clock because its drift will only be cumulated over the time period which separates a given instant in the running of the program from the establishment of the certification link. It suffices to require users to certify their participation within a relatively short period (between a few hours and a few days), which does not in practice raise any particular difficulty, in order easily to overcome these drift problems. The device according to the invention does not therefore depend on expensive components while providing very reliable certification conditions.

Preferably, the first event is constituted by the entry of a participation datum in the device and the second event is constituted by the absolute deadline of entry of this participation datum, this deadline being known to the server. The method of certification is in this case particularly reliable because it depends on a measurement of time initiated by the user when the user enters a participation datum in the device, whose electronic circuits can easily be made inaccessible to any external intervention as will be described below.

According to one characteristic of the invention, the scenario comprises parameters representing the chronological running of the program and the device comprises a device for timing for the implementation of the scenario according to the chronology. Preferably, these parameters are remotely loaded into the device but, as a variant, they can be programmed in the latter when it is personalized, assuming that the chronological running of the programs subject to participation is standardized.

Preferably, the device comprises a data processing device for producing a result which is a function of the participation datum and the comparison device is adapted to certify or not to certify the result.

The certified result can be credited to its beneficiary in a storage device disposed in the server and/or in the user's device. Similarly, the comparison device can be part of the server and/or of the device. In each case, the device and the server preferably comprise an additional device authentication for the purpose of verifying the receivability of a certification request.

According to a preferred embodiment of the invention, the certified result is credited in the device and the comparison device is disposed in the server.

Another subject of the invention is a system allowing individuals to participate in a broadcast program from a receiving set and, in association with a server, to certify by time logging their participation in the program by means of a device such as defined above, this system comprising:

participation devices each associated with an individual participating in the program, device for broadcasting the program to receiving sets, and at least one server fitted with terminals for the establishment of certification links with the participation devices.

The other characteristics of the invention are defined in the claims.

BRIEF DESCRIPTION OF THE DRAWINGS

Various embodiments of the invention given by way of example will be described below with reference to the appended drawings in which:

FIG. 1 is a simplified block diagram of a portable electronic device according to one embodiment of the invention.

FIG. 2 is a plan view of the device.

FIG. 3 is a view in the direction of the arrow III in FIG. 2.

FIG. 4 is a diagram illustrating the use of a device in association with a television receiver set.

DESCRIPTION OF THE PREFERRED EMBODIMENTS

Figure 5:
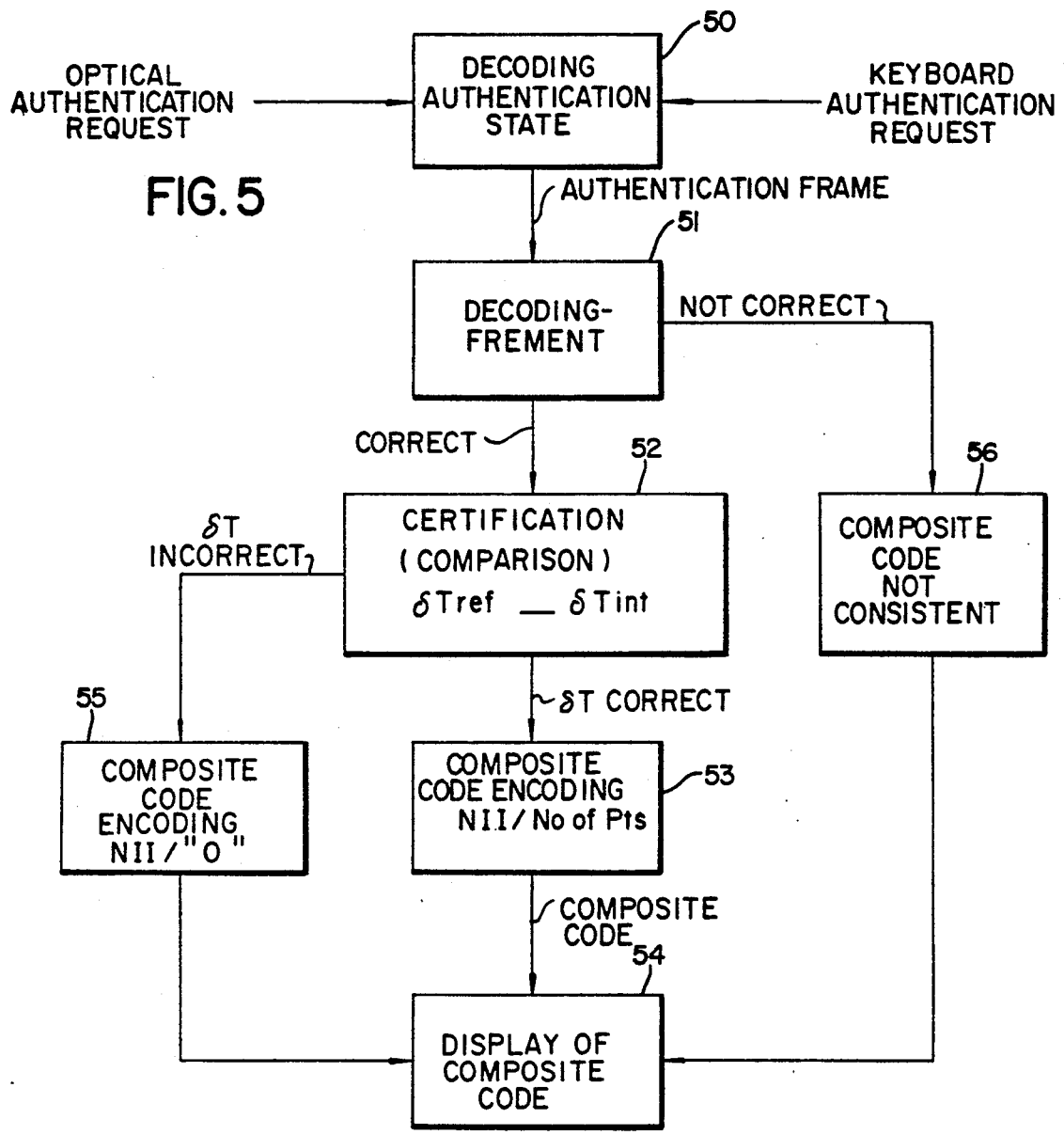
FIG. 5 is a functional diagram illustrating the steps in a certification and authentication procedure by means of a first embodiment of the device of the invention.

Referring to the drawings, particularly to FIGS. 1 to 3, there can be seen a portable electronic device 1 intended to receive data from a screen in optical form. A device of this type is described in detail in the French Patent Application FR-A-2 630 561 to which reference can be made.

This device comprises an external casing 2 (FIG. 2) of rectangular parallelepipedic shape, preferably made from plastic material, and whose thickness e (FIG. 3) is small with respect to its width 1 and its length L. Preferably, the size of the casing is adapted so that the latter can be held in the hand of the user.

The device comprises means of optical reception R advantageously constituted by phototransistors 3 (FIGS. 2 and 3) disposed on the section of a small side of the casing 2, and in particular in alignment. In the considered example, the phototransistors are three in number.

The means of reception R, as shown in FIG. 1, are connected to a microcomputer 4, by means of processing means 5 capable of converting the light signals received into electrical signals having a format suitable for the microcomputer 4.

The device 1 comprises a display 6, preferably a liquid crystal display (LCD), forming a rectangular screen 7 (FIG. 2) on the casing. Preferably, this screen 7 is provided for displaying eight aligned alphanumeric characters. The display 6 allows the display of information coming from the microcomputer.

An electrical power source 9, generally constituted by an electrical battery of small dimensions, is provided for supplying the various circuits. Preferably this battery is buried inside the casing 2 during the manufacture of the device in such a way as to make it inaccessible and to prevent its replacement and any access to the supply conductors of the various electronic circuits of the device, which are also buried in the casing 2. As a variant, this inaccessible battery can be reserved for the supply of the clock and RAM memory circuits and the other circuits can be supplied by a replaceable battery.

The device furthermore comprises a keyboard 8 in particular constituted, as shown in FIG. 2, by keys t, ten of which respectively correspond to the ten digits 0 to 9. The keyboard 8 is completed by a certain number of function keys, namely:

a "TELE" key, which allows a change into optical mode for the remote loading of data from a screen; as a variant, this key can be eliminated if the microcomputer 4 is programmed to be activated by interruptions coming from optical reception means R and processing means 5;

a "C" key which allows an incorrect data entry to be cancelled;

an "ENT" key which allows a data entry to be accepted;

an "ACTION" key which allows the starting of games not requiring the reception of data by the optical reception means R.

a "CL" key which allows the display on the screen 7 of winnings gained with the device;

an "ID" key which allows the change into identification mode if the device is fitted with this function and allows the starting of a manual certification and authentication procedure.

The microcomputer 4 is a masked CMOS technology microcomputer. It can be a Motorola MC68HCφ5B6 type for an auto-programmable microcomputer version or a NEC 753φ8 for a version with RAM memory storage, or a specific circuit type (ASIC) for a protected RAM version. The specific circuit will be developed from a standard microcomputer of the previous types in which the means of protection of the memory will be included. These means of protection may be constituted by a fuse which is blown after writing into the memory.

The microcomputer comprises a read only memory (ROM) 11 and a storage memory 12.

The read only memory 11 is organized as two areas, namely:

a program area in which are stored the instructions relating to:
the optical reception and decoding function
the possible identification function
the authentication function
the device personalization function
the application functions allowing the implementation of televised or other games;

and a manufacturing area for storing information relating to the manufacture of the card and for initializing the product, this information relating to:
the customer code,
the number of the mask used for the microcomputer;
the manufacturing key, in particular constituted by 128 bits, allowing personalization to be checked.

The storage memory 12 of the device contains two categories of data, namely:

operating data, for the storage of information relating, for example, to a bet or a game, or other applications if the read only memory is programmed for this purpose; and personalization data containing information relating to:
the confidential code, if the identification function is programmed in the read only memory;
secret authentication key;
the operating parameters (for example inhibiting the card after four failed attempts at identification);
the various secret keys possibly necessary for the application functions;
the authorized lifetime of the device.

The storage memory 12 can be a PROM or an EEPROM, or advantageously a RAM backed up by the power supply source. The RAM memory is inaccessible from the exterior of the device and any attempt causes the erasure of the information which is written in it and makes the device impossible to use. The personalization data is stored in it only once but; the operating data can be modified. The protection of the personalization data in RAM memory 12 results from the simple structured programming of the microcomputer 4.

The data bus and the address bus (not shown in the drawings) of the microcomputer 4 are not accessible from the exterior in order to make it impossible to carry out a reading or a fraudulent modification from the exterior of information contained in the read only memory 11 and the storage memory 12 of the device 1.

If the microcomputer 4 is programmed to provide an identification function, the device can only be rendered active after operating the ID key and the entry, on the keyboard 8, of a confidential PIN identification code of the user of the device. This confidential code is known only by the holder of the device 1.

The program stored in the memory 11 can furthermore be provided for inhibiting the device 1 after the consecutive entry of a certain number of incorrect confidential codes on the keyboard 8, for example four codes. The device 1 then becomes impossible to use, and the reactivation of the device can only be carried out by means of a special procedure, for example at a server center.

Optionally, the device 1 can be provided with a specific means 14 of transmission of data to the exterior, particularly to a server, for the purpose of the implementation of procedures which will be described below. These means of transmission can be optical, electrical, radioelectric, acoustic or other types and can assume any appropriate form known to those skilled in the art.

In addition to the system clock (not shown) belonging to the microcomputer 4, the device 1 is also fitted with a clock 10. This clock can be constituted, for example, from a time base IOA and a counter IOB permanently supplied by the power supply source 9. At each overflow of its content, i.e. at regular intervals, the counter IOB transmits an alarm pulse to the microcomputer 4. The latter increments the time elapsed since the personalization of the device and then returns to the standby state until the appearance of the next pulse from the counter IOB. When the authorized lifetime of the device has elapsed, this information being stored in the memory 12 during the personalization of the device, the microcomputer 4 is programmed to inhibit automatically the functioning of the device 1, for example by the erasure of the content of the personalization information in the memory 12.

The clock 10 also has the function, with the microcomputer 4, of providing certification of the results or winnings obtained after a participation in a television or similar program.

The programs concerned can be of different types:

For example, the programs can be televised games, sports transmissions, cultural transmissions, teaching transmissions, films, etc. . . , during which the viewer must answer one or more questions asked during or at the end of the transmission.

The programs can also be games of chance such as a lottery or draw type in which, for example, after the remote loading of a random or pseudo-random number in the device, the player has a certain time in which to make, by means of the keyboard 8, a bet which can consist in the placing of a certain sum or of a certain number of points previously loaded or won in the device. This sum or these points can have previously been credited in the memory 12 of the device by means of the purse function described in the Patent Application FR-A-2 630 561. After this time, the microcomputer 4 processes the remote loaded number by means of an appropriate algorithm and displays either winnings, or a number which has to be compared with the result of a draw carried out during transmission in order to determine if the player has won. this comparison is to be carried out in the microcomputer 4 by means of a second remote loading sequence by means of the reception means R.

The game scenarios which can be envisaged are extremely numerous and are not the subject of the present invention. The latter aims in a general way at allowing an in vidual, a) to participate in a program broadcast program by entering, using the keyboard of the user's device, one or more data representative of the user's participation, which may be one or more answers to one or more questions asked at the start, during or at the end of the program, one or more random numbers chosen by the individual as part of a lottery, the staking of a certain amount (money, points), etc. . . , and, b) to validate the result of this participation in association with a server. For the purpose of simplification, the invention will be more particularly described hereafter in its application to games calling upon concatenations of questions and answers.

The transmissions or programs can be broadcast to television receivers by a wired network or by a hertzian or wireless transmission, to remote data processing terminals (for example of the MINITEL type), to computer terminals, or to radio receivers if the device is fitted with appropriate means, such as described for example in the U.S. Pat. No. 4,745,468, for the remote loading of the scenario.

In the particular embodiments described with reference to the figures, the device 1 is provided with a means of optical reception R. The data or parameters defining the scenario which will allow the viewers to participate in a program, hereafter also called a game, are transmitted by a transmitting station E (FIG. 4) at the start of the latter in the form of a variable luminous image such as a pattern P which is displayed in picture-in-picture mode on the screen 15 of a television receiver set 16.

The data is preferably encoded and essentially comprises the following information:

1.) the nature of the broadcast game, corresponding to a program stored in the ROM memory 11 of the microcomputer 4;

2.) the chronological running of the "game" whose parameters are:

a) the times at which the device asks the player to answer questions;

b) the time allocated for each answer;

3.) the correct answers to the questions asked;

4.) possibly the winnings allocated to the correct answers, these winnings being able, as a variant, to be programmed in the microcomputer as a function of the nature of the detected game.

With the data, associated consistency check codes (CCC) and error detecting codes (CRC) are necessary for ensuring security, the reliability of the game and protection against fraud.

The chronology of the remote loaded scenario is such that, in the devices, the game runs in synchronism with the program broadcast by the transmitting station.

When the quantity of information transmitted to the devices during a remote loading operation would be insufficient to control the running of the game throughout the transmission, several remote loadings can be used during the transmission.

In order to participate in the game or broadcast program, the player must first remotely load into the device the abovementioned scenario data transmitted by the transmitting station E (FIG. 4). Depending on the quantity of data to be transmitted, remote loading into a device can take from a fraction of a second to several seconds. This time being very short, it is necessary to repeat the remote loading sequences on the screen for a sufficient period of time, for example from a few tens of seconds to more than one minute, in order to ensure that the viewers have been able to remotely load the scenario of the coming game into the device properly.

Consequently, certain devices will be remotely loaded at the start of the remote loading period, others at the end of the period. These devices will exhibit a mutual phase difference, while the procedure requires good synchronization between the running of the scenario in the devices and the running of the broadcast program.

Various solutions can be envisaged for solving this problem, the simplest consist of transmitting, in each remote loading sequence, information representative of the delay of this sequence with respect to the initial remote loading sequence. This information will be taken into account by the microcomputer 4 in order to initialize the timing of the running of the scenario.

Pressing the "TELE" key has the effect of generating an interrupt selecting the optical data reception program of the microcomputer 4. If the device is fitted with an identification function, the individual must previously activate it by pressing the "ID" key and then by entering a confidential identification code (NID) on the keyboard 8. As a variant, the abovementioned interrupt can be generated by a special optical frame preceding the transmission of the data to be remotely loaded.

As soon as the appropriate pattern (luminous bars p) appears on the screen 15 (FIG. 4), the user must place the device against the latter at the required place. The optical reception means R converts the brightness variations of the screen 15 into electrical signals which are converted into binary signals in the format required by the processing means 5. The received data are decoded (decoding) by the microcomputer 4 which, when it has received all of the required data, causes a message such as "READY" to appear on the screen 7 of the display 6 indicating that the device is ready to operate.

The user then only has to watch the program until the first question is asked, either orally or in written form in picture-in-picture mode on the screen. The time period given for answering can be displayed on the screen 15 in the form of a countdown in seconds, and at the same time the microcomputer 4 can invite the user to answer by displaying information on the screen 7, for example the sign "?".

The user then enters an answer on the keyboard and confirms it by pressing the "ENT" key and, from that moment onwards, the microcomputer 4 counts the time which elapses, timed by the clock 10, for the purpose of a subsequent certification of the result or score obtained by the user at the end of the game.

The latter is carried out within the electronic device 1 in synchronism with the running of the transmission, the player having to enter an answer each time on the keyboard within the fixed time period.

The microcomputer 4 compares each answer entered on the keyboard 8 with the correct answer remotely loaded and stored in the memory 12 and updates the player's score as a function of parameters which either have been remotely loaded or are part of the program of the microcomputer relating to the game in question. The microcomputer can be programmed to display on the screen 7 a message indicating whether or not the player has given the correct answer ("WELL DONE", "SORRY"), whether or not this correct answer is given on the screen 15 during or at the end of the transmission.

The microcomputer 4 can also be programmed to display on the screen 7 the score achieved by the player at the end of the game, either as a number of correct answers, or as a number of points or in any other appropriate form. Operating the "CL" key also allows, depending on the programming of the microcomputer 4, the display of the score achieved during the last game or during several previous games cumulated.

Outside of its operating periods (computation, processing of keyboard keys etc. . . . ) the microcomputer 4 automatically sets itself in the standby state in order to reduce the consumption of electrical power. However, as mentioned before, the microcomputer is periodically reactivated by the clock 10, which allows the time elapsed since the entry of the first answer to the game to be taken into account.

When the user wishes to have the winnings or result which the user has obtained by participating in this game validated, the user must be placed into communication with an authorized server, for the implementation of a double certification and authentication procedure. This server is for example a computer which has in memory the absolute time limits of reference events of programs or transmissions for which the players are able to have the results validated. This server is also fitted with a clock synchronous with the clock 10 of the device 1 and allowing the computation of the elapsed time between the absolute time of one of these events and the absolute time at which a player enters a request for certification and authentication of the result for the game in question.

In a first embodiment of the invention which will be described hereafter, the winnings achieved by the user are credited in the server S.

The call upon the server can be carried out in different ways, for example, by telephonic communication with an operator of the server or by means of a data processing terminal or a conventional remote data processing terminal or of a specific terminal connected to the server. Depending on the case, the request for certification and authentication can be transmitted to the microcomputer 4 by the means of the keyboard 8, or by optical reception means R.

If the server is capable, at a given instant, of validating the results obtained in several different games, provision can be made for the player to indicate a code to the server, for example a number, identifying the game for which he the player desires to have the result validated.

At the same time, the device 1 must, after possibly having been made active by the identification procedure, be put into a state of receiving the request for certification and authentication, either by pressing the "ID" key if the request is transmitted in the form of a digital code by means of the keyboard, or by pressing the "TELE" key or by receiving a special optical frame if the request is transmitted to the reception means R in optical form: this state is decoded by the microcomputer 4 (step 50, FIG. 5).

The request received from the server (optical frame or digital code transmitted by an operator or displayed on the screen of a terminal) at the player's initiative is an encoded code comprising the following information:

1.) a number identifying the game;
2.) a value $\delta T_{ref}$ which represents the time difference between the end of the answer time for the first question asked (deadline) and the moment of transmission by the server of the request for certification and authentication; and 3.) a random or chance number.

This code is transmitted to the microcomputer 4 (reception means R or keyboard 8) which provides the decoding 51 using an algorithm installed in the ROM memory 11.

If the encoding is correct, the microcomputer 4 compares the value $\delta T_{ref}$ received from the server with the value $\delta T_{int}$ representing the measured time between the instant of entering the answer to the first question of the game in question and the instant of reception by the microcomputer of the request for certification and authentication (step 52).

If the difference between these values is less than a defined tolerance $\pm t$, the winnings or result of the game are certified and the microcomputer 4 transmits a composite code (step 53) by encoding, according to a given algorithm, as a function of the random number transmitted by the server, the certified winnings or result and an internal identification code (NII) loaded into the storage memory 12 during the personalization of the device.

This composite code is displayed on the display 6 (step 54) in alphanumeric form in order to be transmitted to the server (by telephonic means, entry on the keyboard of a terminal or reading by a terminal or specific terminal as described for example in the French Patent Application 89 10201) for the purpose of a running of the authentication procedure which will be described in greater detail hereafter. As a variant, this composite code can be transmitted to the server by the transmission means 14 if the device is fitted with it. Its display on the screen 7 can then be omitted.

If, in step 52, the difference between $\delta T_{int}$ and $\delta T_{ref}$ is not correct, the microcomputer transmits a composite code with a zero result or winnings information (step 55) and displays this code (step 54).

Finally, for any other type of error, such as the detection of an incorrect encoding in step 51, the microcomputer transmits an inconsistent composite code (random data) in order to protect itself against fraud (step 56) and displays this inconsistent code (step 54).

The total number of composite codes per day can be limited: above a defined number, the device transmits an inconsistent composite code in order to protect itself against fraud (successive attempts).

Furthermore, the time difference between the end of a game and the request for certification and authentication must preferably be limited, for example half of a day, in order to take account of the possible drifts of the clocks of the various devices in service. A duration of this order is sufficiently short for the differences between the various clocks to remain within an acceptable tolerance range.

Figure 6:
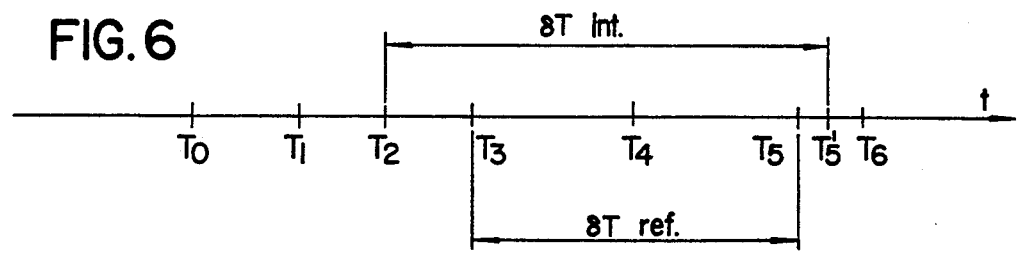
FIG. 6 is a diagram illustrating the certification function provided by the procedure in FIG. 5.

FIG. 6 shows, in the form of a timing diagram, the steps separating the start of a game from the request for certification and authentication. In this figure:

$T_0$ represents the absolute start time of the game, i.e. the end of the first of the successive initial remote loading sequences;

$T_1$ is the absolute time at which the first question has been asked;

$T_2$ is the absolute time at the which the player has entered the answer to the first question in his device;

$T_3$ is the absolute deadline for answering the first question;

$T_4$ is the absolute time at which the answer to the first question was given on the screen;

$T_5$ is the absolute time at which the server, having acquired a request for certification and authentication, transmits the latter;

$T'_5$ is the absolute time at which the microcomputer 4 receives the request for certification and authentication from the server;

$T_6$ is the absolute time of entry in the server of the composite code generated by the device 1.

$\delta T_{int}$ is the relative time computed by the microcomputer 4 between the absolute $T_2$ of entry of the answer to the first question and the absolute time $T'_5$ of the reception by the latter of the request for certification and authentication;

$\delta T_{ref}$ the relative time, computed by the server, between the absolute deadline $T_3$ for answering the first question and the absolute time $T_5$ of transmission by the server of a request for certification and authentication.

In the present specifications, the term "time" is understood to mean the position of an event in an absolute time scale of defined origin, for example the normal calendar. It will be assumed that the times and consequently the "times", are measured to the nearest tenth of a second.

From the above it results that:

$$\delta T_{int} = T_5 - T_2$$

If, to a first approximation, it is considered that $T_5$ and $T'_5$ are merged, the absolute time $T_2$, which is the only unknown variable, is equal to:

$$T_2 = T_5 - \delta T_{int}$$

Consequently, even though the device 1 only measures relative times, by means of the absolute clock time $T_5$ supplied by the server, it is possible to know the absolute clock time $T_2$ of the player's answer to the first question (i.e. to time log this event) and to check whether this answer has been given before the absolute clock time $T_3$ at which the correct answer was broadcast.

It should be noted that the start point of $\delta T_{int}$ is not necessarily that of the answer to the first question: it can be the answer to the $n^{th}$ question since the chronology of the scenario for running the game is fixed by the remote loaded data. In this case, the start point of $\delta T_{ref}$ will be the end of the time period for answering the $n^{th}$ question. As a variant $\delta T_{int}$ can be measured or computed from a predetermined event of the scenario, for example $T_0$, $T_1$, $T_3$ etc. . .

In practice, the server computes $\delta T_{ref}$, transmits it to the device as mentioned before and the microcomputer 4 compares $\delta T_{int}$ and $\delta T_{ref}$.

As a variant, the value $\delta T_{int}$ and the result computed by the microcomputer 4 can be transmitted from the device 1 to the server which makes the comparison between $\delta T_{int}$ and $\delta T_{ref}$ and certifies or does not certify the result.

However, in either case, the certification of the result results from the measurement, by the microcomputer 4 and the clock 10, of the "certificate" which is constituted by the time $\delta T_{int}$.

The result is certified if the difference between $\delta T_{ref}$ and $\delta T_{int}$ is less than a defined tolerance $\tau$. This tolerance $\tau$ is fixed as a function of the maximum predictable drift of the clocks of the devices with respect to the maximum time period imposed for having a result validated (half of a day for example), of the accuracy of the measurement of the times and of the maximum time period authorized between the time $T_5$ of provision by the server of the data (game code, $\delta T_{ref}$, random number) and the time $T'_5$ of entry of the composite code in the server.

In the case in which the composite code is entered via the keyboard of the device, the acceptable time period must be long, of the order of several tens of seconds, in order to allow users enough time to carry out the necessary operations. The microcomputer 4 stops its computation of the time $\delta T_{int}$ at the time $T'_5$ later than the time $T_5$. A maximum time period $T_6 - T_5$ will be imparted to the server for accepting the composite code associated with the data supplied to the device.

The overall tolerance $\tau$ will have to take account of the abovementioned parameters while being less than $T_4 - T_3$, i.e. the time separating the deadline for supplying an answer by the players from the time of supplying the correct answer on the screen.

Figure 7:
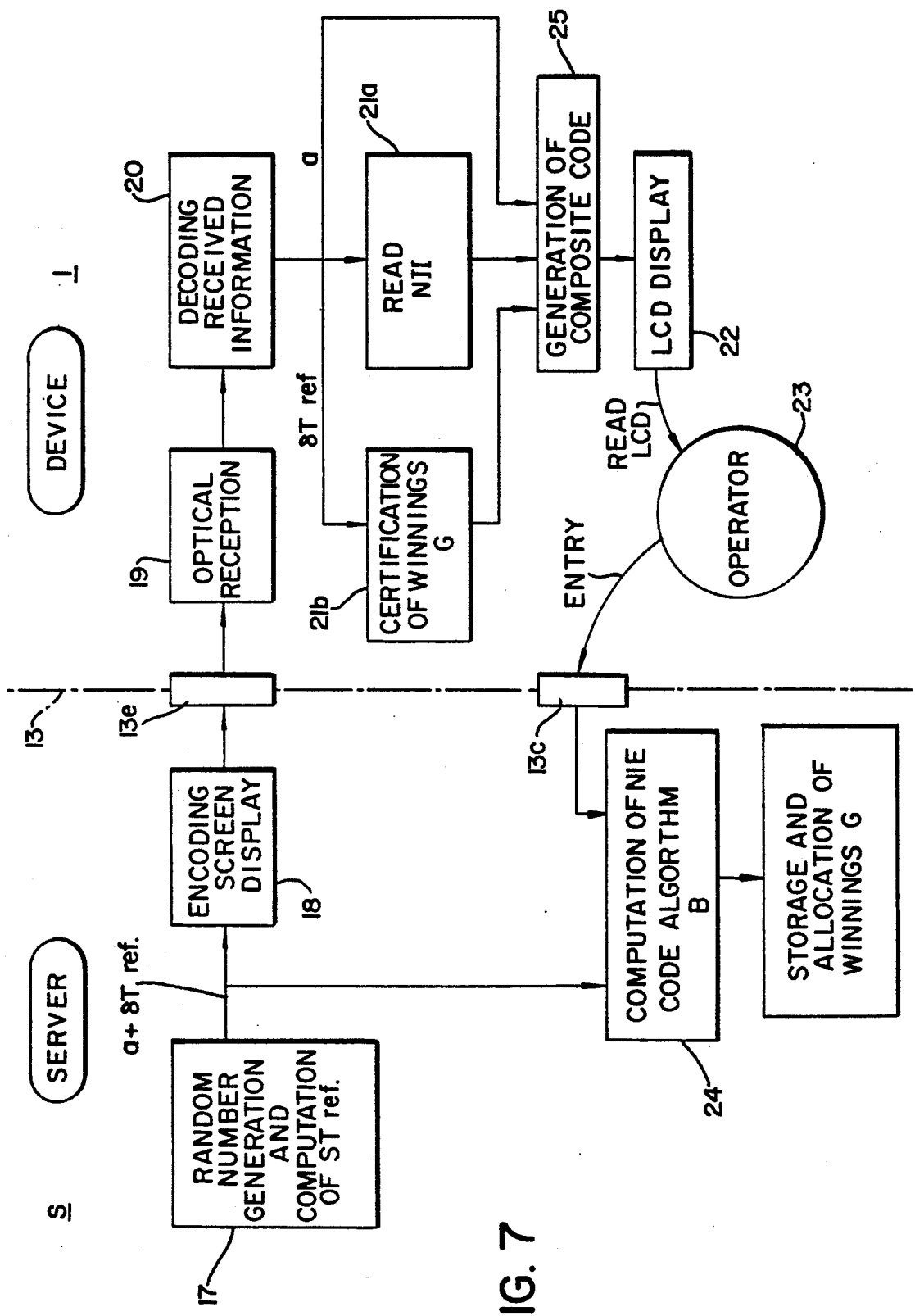
FIG. 7 is a diagram illustrating the implementation of the certification and authentication procedure in FIG. 5.

FIG. 7 is a functional diagram illustrating the implementation by an optical means of the certification and authentication procedure of FIG. 5. The left-hand section of this figure corresponds to the automatic communications unit of the server S. The section located to the right of the dotted and dashed line (which represents a terminal 13 of the server S) corresponds to the device 1.

The block 17 corresponds to the generation of a random number a and the computation of the time $\delta T_{ref}$ by the server S. The block 18 corresponds to the encoding and to the display of these data on the screen 13e of the terminal. The block 19 corresponds to the optical reception of the data by the phototransistors 3 of the device 1. The block 20 corresponds to the decoding, by the microcomputer 4, of the received data. The block 21a corresponds to the reading by the microcomputer 4 of the NII code and the block 21b corresponds to the certification of the result G (comparison $\delta T_{int}$, $\delta T_{ref}$). The block 25 corresponds to the computation by the microcomputer 4 of a composite code x from the NII code, the result G, the time $\delta T_{ref}$ and the received random number a, according to an algorithm A. The block 22 corresponds to the display on the screen 7 of the device 1 of the composite code x computed in 25.

The user, represented by a circle 23, after reading on the screen 7, enters on the keyboard 13c of the terminal 13 the code x displayed on the screen 7.

The block 24 corresponds, in the server S, to a computation carried out, using a random number a according to an algorithm B correlated with the algorithm A, on the composite code x in order to decode the result G and to compute an external identification code NIE, the result G being validated when there is consistency between the external identification code NIE and control information known to the server. If the algorithm B is symmetrical with the algorithm A, the codes NIE and NII are equal in the case of consistency.

If consistency is established, the result or winnings G thus validated is stored in memory by the server and allocated to the holder of the device, who is identified, for example, by the code NIE (block 25). In the case when there is no consistency, the result is not allocated.

The consistency can be established, for example, by processing the code NIE, as a function of predetermined encoding rules, and/or by correlation of the code NIE with external information entered by the user in the server, for example the serial number of the card, the name of the user, a password etc. . .

Figure 8:
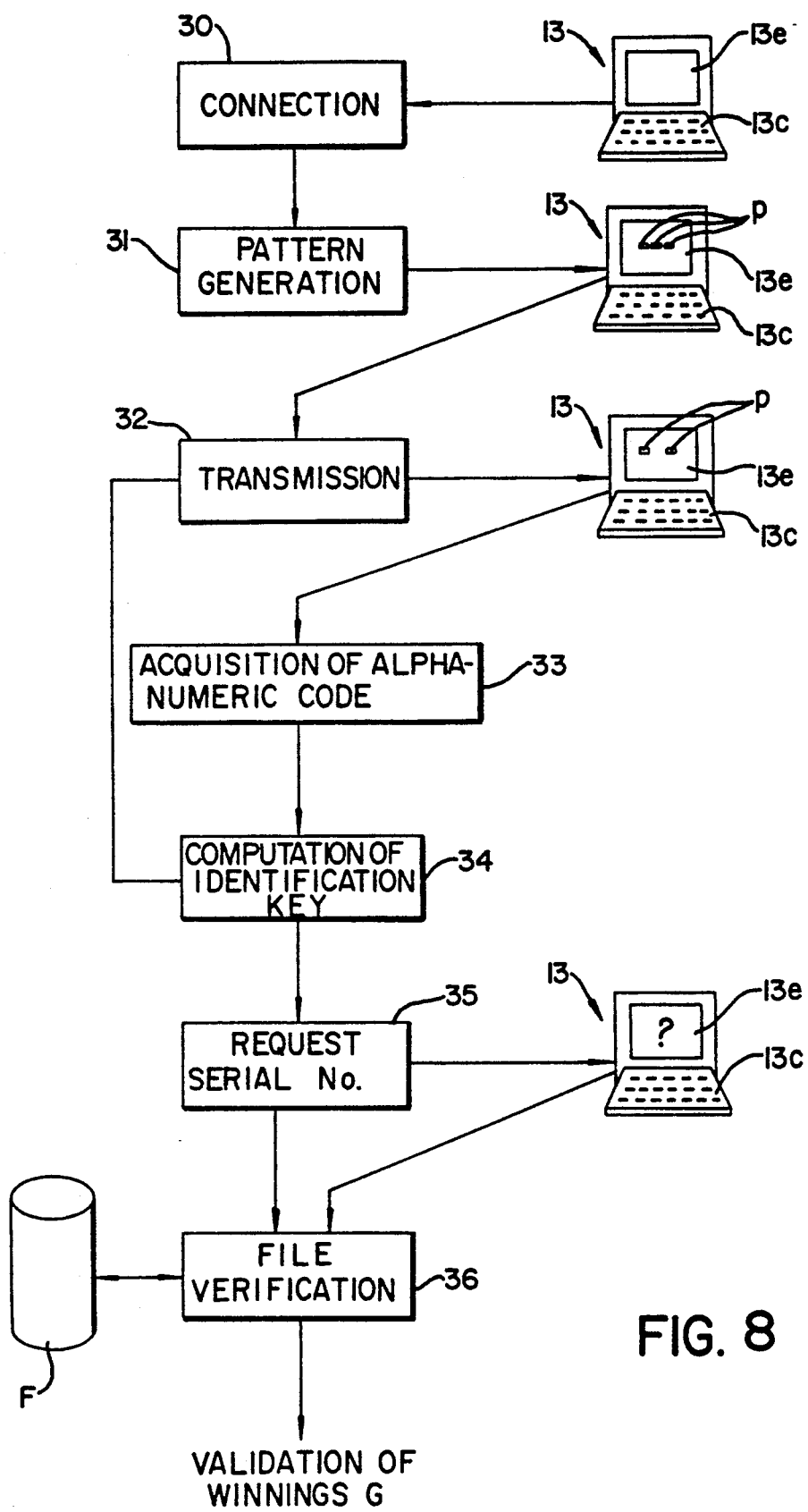
FIG. 8 is a diagram illustrating the implementation of the certification and authentication procedure of FIG. 5 using a screen and keyboard terminal connected to a server.

FIG. 8 is a diagram illustrating the running of the certification and authentication procedure using the device 1 of the invention, in association with a server S provided with a screen and keyboard terminal 13. This FIG. 8 explains certain of the functions described with reference to FIG. 7.

The operator, from the terminal 13, firstly transmits to the server S the access request and then the request for validation of winnings in a given game by typing, on the keyboard 13c of the terminal 13, the desired information. The block 30 corresponds to the setting up of the connection with the server S which generates a pattern (block 31) i.e. causes the appearance on the screen 13e of the terminal of the luminous bars p which, in the example shown, are constituted by three aligned rectangles.

The operator then presents the device 1 in such a way as to place the phototransistors 3 opposite the bars p and presses the "TELE" key of the keyboard 8. The device 1 is in position for receiving information by the optical means.

The user then presses a key of the keyboard 13c of the terminal. The server S, in response to the pressing of the key of the keyboard 13c, generates and transmits, to the terminal 13, in encoded form, the random number, the number of the game and the time $\delta T_{ref}$, as indicated by the block 32. The corresponding information is represented on the screen 13e by variations in the brightness levels of the bars p, this information being received by the device 1. The latter certifies or does not certify the result G and causes the appearance on the screen 8 of a composite alphabetic and/or numerical code which the user enters on the keyboard 13c, which corresponds to the block 33 of acquisition by the server S.

The block 34 corresponds to the computation, by the server S, of a code identifying the device, from the random number generated in 32 and the composite code entered at the keyboard 13c.

The server then asks the operator to type on the keyboard 13c the serial number appearing on the device in the operator's possession (step 35). The server S verifies, in a file F, as indicated by the block 36, the agreement between the serial number and the number or NIE code computed by the block 34. When consistency is established, the winnings G are validated and allocated to the user in a memory of the server, for example by asking the latter for identification on the terminal 13c.

In the embodiment which has just been described, the results or winnings obtained by the participants are managed in a centralized manner at the level of the server.

Such management is relatively awkward and, depending on the applications, it may prove more advantageous to credit the winnings obtained by an individual directly in the individual's device.

This solution offers the advantage, when the device is portable, that the holder can easily use the credit available to the holder either for participating in new games, or at any place (point of sale for example) fitted with a terminal capable of authenticating the device and of reading and debiting the protected credit memory. This terminal is not necessarily connected to the server if the credited winnings in the device have previously been validated.

For security reasons, it may then be preferable for the winnings to be credited, inside the device, in a section of its memory 12 constituted by a conventional protected memory of the type encountered, for example, in the field of microcircuit cards. Such protected memory cards are described, for example, in the work entitled "Les cartes a microcircuit" (microcircuit cards) by F. Guez and C. Robert, published in 1988 by MASSON (France).

A second preferred embodiment of the invention will be described with reference to FIG. 9, which shows a procedure for the certification and authentication of the result credited in the device 1.

In this Figure, the section located to the right of the dotted and dashed line corresponds to an automatic communications device of the server S. The section situated to the left of the dotted and dashed line (which represents the interface or interfaces between the device and the server S) illustrates the functions implemented by the device 1, which is assumed to be portable.

The holder of the device 1, hereafter also called the player, is assumed to have participated in a program (bet, lottery, interactive game. . . ) as previously described and to have obtained certain winnings which he wishes to have validated in the device.

In order to do this, the validation procedure must be initiated in the device 1 by operating a key or a combination of keys of the keyboard 8 (step 100). Preferably, the device comprises a "validation" key (not shown), for example replacing the "ID" key previously described. The initiation of the certification and authentication procedure may or may not be subordinated, after operating the "validation" key, to the entry by the user of a confidential identification code.

The operation of the "validation" key, followed or not followed by the entry of the confidential identification code, generates, in the microcomputer, an interrupt having the effect of starting the running of a certification and authentication program. In the first step 101 of this program the microcomputer determines the relative time $\delta T_{int}$ which has elapsed between the absolute time of the characteristic event of the participation of the player in the program (bet, answer to a question, etc. . . ) and the absolute time at which the certification and authentication procedure has been initiated as described above.

The microcomputer then generates a certificate (step 102) comprising:

a header, namely formatting data of the certificate;

a secret datum a, which can for example be a random or pseudo-random number generated by the microcomputer, whose function will be explained below;

the time $\delta T_{int}$;

a consistency check code CCC.

The certificate can also comprise other information such as the internal identification code NII of the device in order to complete its authentication by the server, the winnings G contained in the device, etc. . .

The certificate is then encoded in step 103 by means of a variable key known to the server S, it being possible to compute this key for example from the current time and/or a variable information which is part of the data remotely loaded into the device for the participation in the program. An error check code CRC is then associated with the encoded certificate in step 104. Thus the certificate transmitted to the server varies with each program (game, bet, etc. . . ) and with each validation operation.

The encoded certificate is transmitted to the server S by appropriate means represented in the form of an interface $I_1$. If the length of the certificate permits it, the encoded certificate will be displayed in alphanumeric form on the screen 7 of the device and entered in the server, either by the player on the keyboard of a terminal, or by an operator in telephonic communication with the player, or by any other appropriate means. As a variant, the encoded certificate may be transmitted to the server by a digital link between the device and the terminal of the server, for example of the acoustic modem type, the device then comprising a conventional acoustic transducer.

In step 105, the server S carries out a check of the received certificate by means of the error check code CRC which this certificate includes. The next step 106 consists in decoding the certificate and the step 107 is a test carried out on the certificate in order to check its consistency as a function of the consistency check code CCC which it includes.

If the received certificate is determined to be inconsistent, it is rejected. In the opposite case, the server S extracts from the certificate the secret information a (step 108) and the time $\delta T_{int}$(step 109) and computes the time $\delta T_{ref}$(step 110).

The next step 111 is a comparison between the times $\delta T_{int}$ and $\delta T_{ref}$. Depending on whether the difference between $\delta T_{ref}$ and $\delta T_{int}$ is less than or greater than a defined tolerance, the validation procedure in progress is continued or rejected (step 112).

At this stage, or at other times during the running of the validation procedure in the server, the latter can proceed with other operations such as the checking of the internal identification number NII or the storage of the winnings if the certificate contains such information.

If the answer to the test 112 is positive, the server proceeds at 113 with the generation of a validation code containing a validation key intended to be recognized by the device. This validation key can be fixed but it is preferably variable: for example, it can be a function of a datum supplied to the device during the remote loading of the program which has generated the winnings being validated, it can be a function of the instantaneous time, etc. . .

The validation code can also contain other information associated with the use of the device, for example the amount of the winnings which will be allocated in the device to the user, a rule for computing these winnings in the device, etc. . .

With the validation key there is associated a consistency check code CCC and the assembly is encoded in step 114 by means of secret information a, which can also be part of the validation code. In step 115 an error check code CRC is associated with the encoded validation code.

This code is transmitted to the device 1 by means represented by an interface $I_2$ which can consist, either in the display or the transmission by an operator of this code in the form of alphanumeric characters which the user has only to enter into the device by means of the keyboard 8, or in a digital link of the acoustic, luminous or other type. The encoded validation code can for example be transmitted from the server S to the device 1 by generating a luminous sequence capable of being read by the phototransistors 3 which the device is provided with.

In step 116, the microcomputer of the device carries out a check of the received message as a function of the error check code CRC associated with the latter and then carries out the decoding of the validation code as a function of secret information a which the microcomputer knows since it was generated and stored by the latter. The encoding and decoding operations used in steps 103, 106, 114 and 117 make use of conventional software products well known to those skilled in this art.

The consistency of the validation code is tested in step 118 as a function of the associated consistency check code CCC and, in the case of a consistency fault, the validation procedure in progress is rejected.

In the opposite case, the microcomputer proceeds in 119 with the computation of the validation key from the same parameter (for example instantaneous time, information supplied to the device during the remote loading of the program etc. . . ) as that which was used by the server for computing the validation key transmitted to the device.

The microcomputer of the device proceeds in 120 with a test for determining if the validation keys computed on the one hand by the server and on the other hand by the device are equal or consistent. In the negative, the validation procedure in progress is rejected; in the opposite case, the participation in the game is validated in 121, the winnings resulting from it are calculated in 122 and the amount of these winnings is credited in 123 in the protected memory with which the device is fitted.

According to this preferred embodiment of the invention, the winnings are credited directly in the device by means of which they have been obtained, but the certification that these winnings have been achieved by playing with the device before an authorized deadline is carried out in the server.

Figure 10:
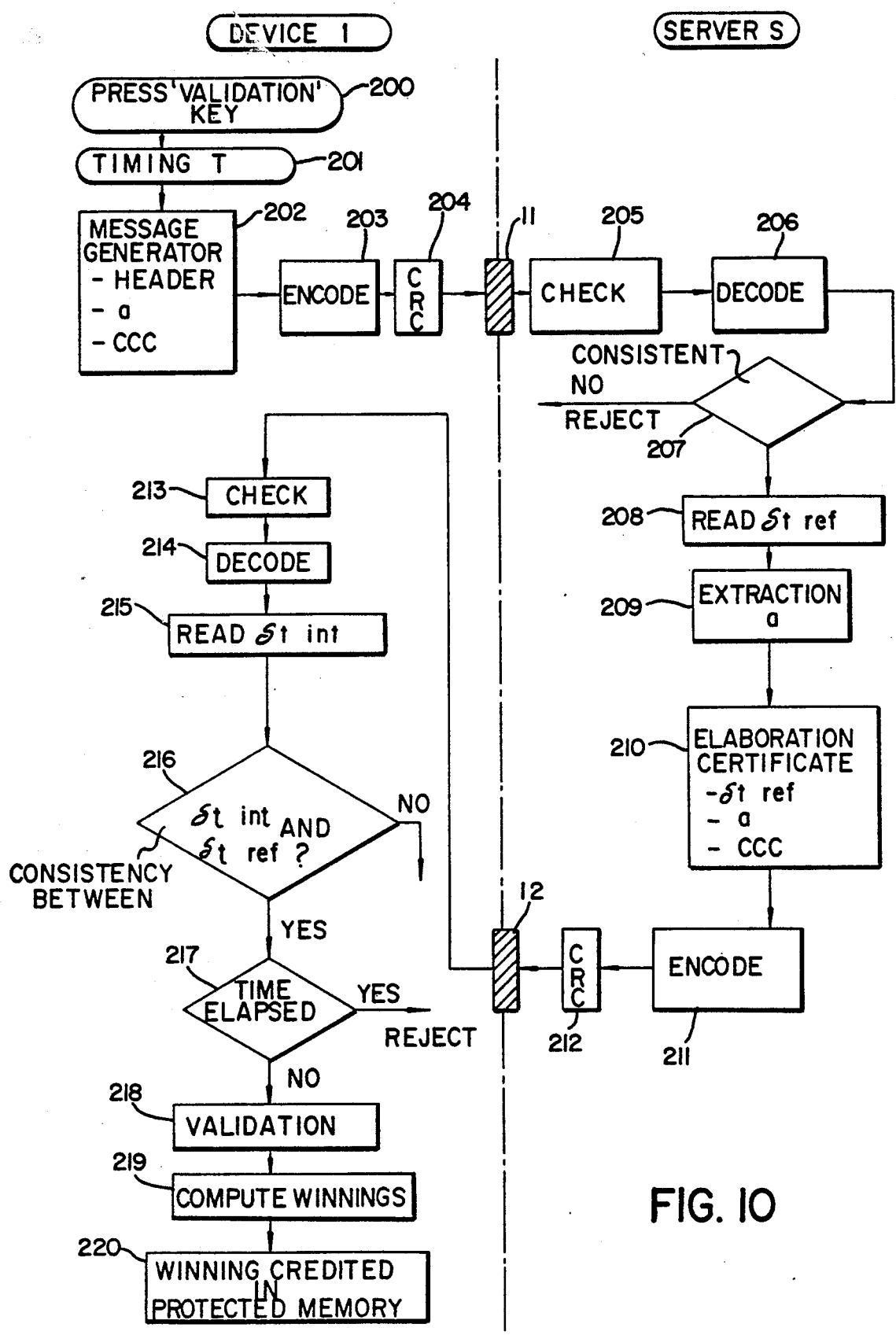
FIG. 10 is a diagram similar to that of FIG. 9 illustrating the implementation of the certification and authentication procedure with a device according to a third embodiment of the invention.

As a variant, according to a third embodiment of the invention, the certification can be operated and the winnings can be credited directly in the device 1 as shown in FIG. 10 to which reference will be made.

Figure 9:
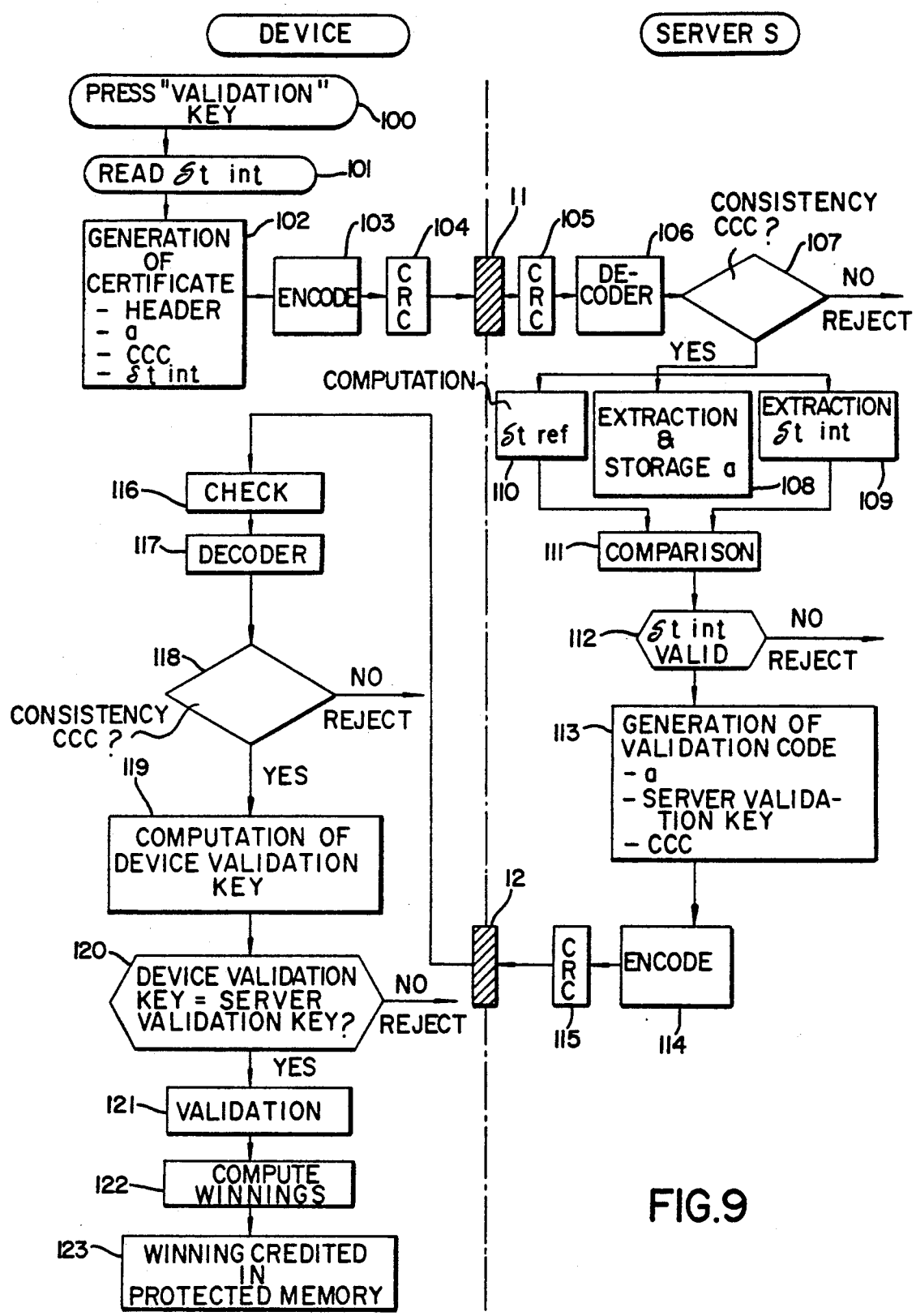
FIG. 9 is a diagram similar to that of FIG. 7 illustrating the implementation of the certification and authentication procedure with a device according to a second preferred embodiment of the invention.

As in the case of FIG. 9, the validation procedure is initiated by operating a "validation" key or a combination of several keys (step 200). This action has the effect of initiating a timing (step 201) for measuring the time which elapses between the start of the validation procedure and the reception by the device of a certificate transmitted by the server as will be described below.

In step 202, the microcomputer generates a message similar to that of step 102 in FIG. 9, except for the fact that this message does not contain the time $\delta T_{int}$. The message generated in step 202 is encoded in 203 as described with reference to step 103, and is then allocated with an error check code CRC in 204.

This message is then transmitted to the server S by means of the interface $I_1$ as described with reference to FIG. 9.

In the server S an error check is performed in 205 by means of the CRC code and the message is decoded in 206. The consistency of the decoded message is tested in step 207 by means of the consistency check code CCC contained in the message. If the message does not appear consistent, the validation procedure in progress is abandoned.

In the opposite case, the server S determines in step 208 the time $\delta T_{ref}$ which has elapsed between the deadline of participation in the program (a time which is naturally known by the server) and the instantaneous time, i.e. the time at which the server has acquired a consistent message representing a validation request.

After this step 208, the server proceeds in 209 with the extraction of the secret information a from the received message and generates in 210 a certificate containing the time $\delta T_{ref}$ obtained in step 208.

As for the validation code generated in step 113 in FIG. 9, the certificate of step 210, in addition to a consistency check code CCC, can contain other information (amount of winnings, rule for computing winnings, etc. . . ) associated with the use of the device. The server can also proceed with an authentication of the device on the basis, for example, of the internal identification number NII of the latter, if it is contained in the message transmitted from the device to the server. On the other hand, in this third embodiment, the winnings cannot, at this stage, be stored in the server for statistical or check purposes as in the case of FIG. 9, as the certification does not take place in the server as, in a second embodiment, but, in the device.

The certificate generated in the step 210 is encoded in 211 by means of the secret information a (information which may or may not be part of the certificate) then the encoded certificate is provided in 212 with an error check code CRC. The encoded certificate is transmitted to the device 1 by the interface means $I_2$ which have been described with reference to FIG. 9.

The microcomputer of the device proceeds in 213 with the checking of the certificate by means of the CRC code, with its decoding in 214 by means of the secret information a generated in step 202 and stored by the microcomputer, and determines in 215 the time $\delta T_{int}$.

The next step 216 is a test enabling it to be determined if there is consistency between the time $\delta T_{int}$ measured in the device and the time $\delta T_{ref}$ generated by the server. In the negative, the validation procedure in progress is rejected.

In the affirmative, the microcomputer examines in 217 whether the time which has elapsed since the initiation of the timing in step 201 is or is not greater than a predetermined duration stored in the microcomputer. This timing and this test have the object of preventing frauds which could consist, after step 212, in delaying the entry in the device of the certificate generated by the server and in thus artificially increasing the time $\delta T_{int}$. If the time elapsed since the initiation of the timing in 201 is greater than the abovementioned predetermined duration, the validation procedure is abandoned.

In the opposite case, the microcomputer validates in 218 the participation in the program, computes the winnings obtained in 219 and credits them in the protected memory reserved for this purpose in 220.

Figure 11:
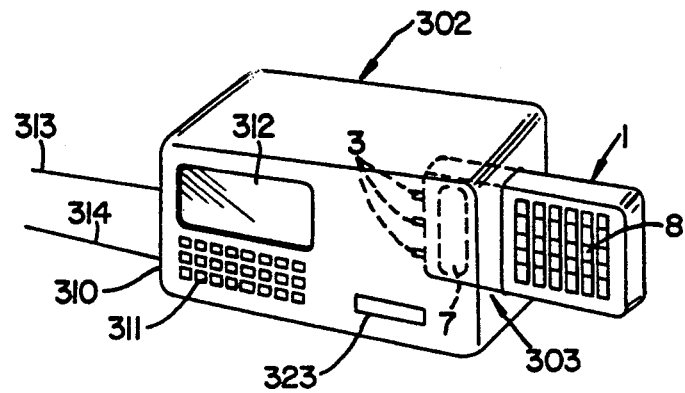
FIG. 11 is a diagrammatic perspective view of a terminal which can be used in association with the device of FIG. 1.
Figure 12:
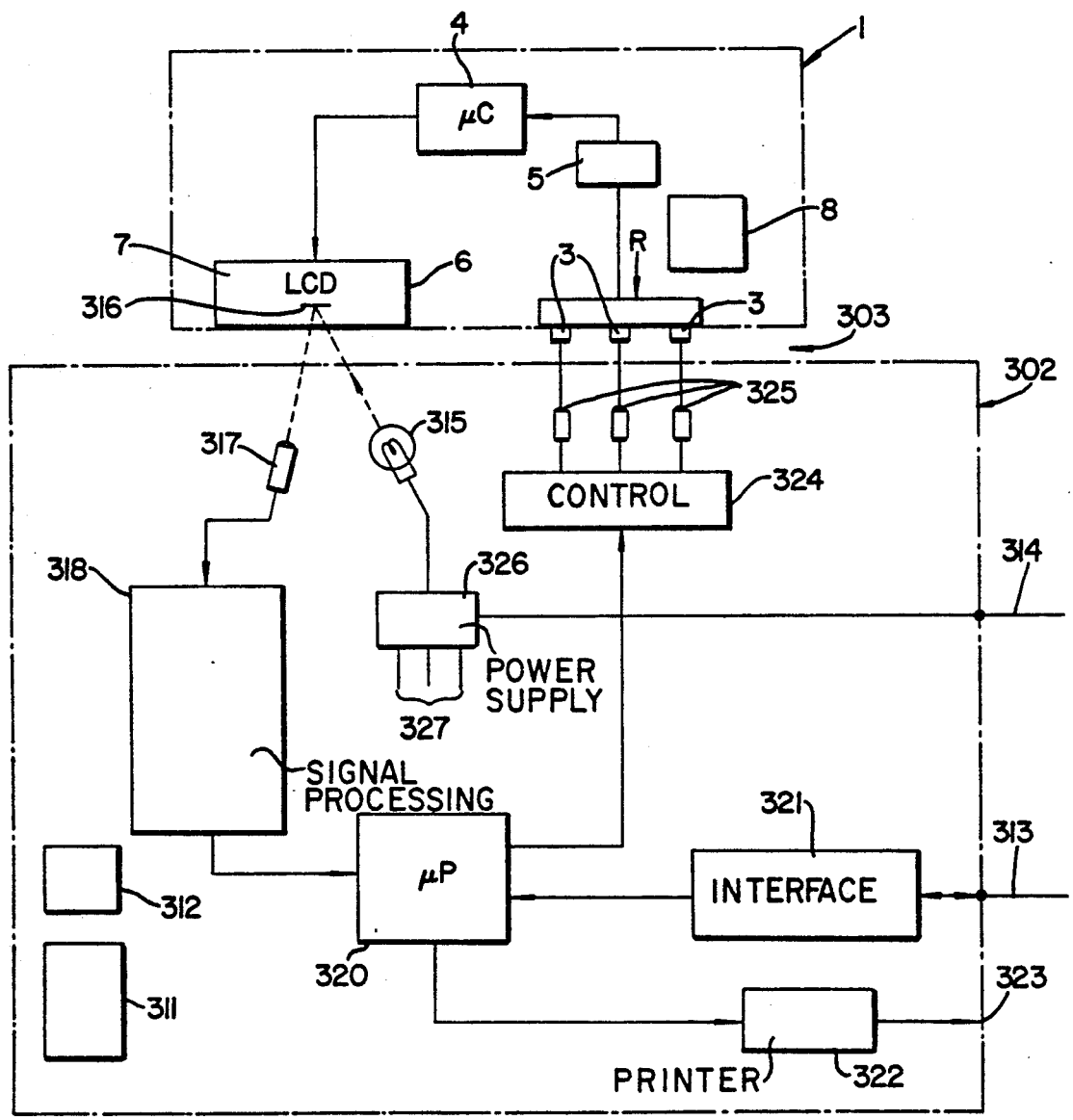
FIG. 12 is a functional diagram illustrating the data exchanges between the terminal of FIG. 11 and the device of FIG. 1.

When the player wishes to use the winnings stored in the portable device, the player must establish a link with an independent terminal or one which is connected to the server S, according to a procedure similar to that described with reference to FIG. 8, in order to debit the memory of the device with all or part of the winnings and to obtain a counterpart in the form, for example, of a voucher, ticket or other medium. This terminal can be a conventional screen and keyboard terminal or, for example, a specific terminal such as the terminal described with reference to FIGS. 11 and 12.

Such a terminal is the subject of the French Patent Application 89 10201 to which reference can be made. This terminal 302 comprises, in a casing 310, in addition to a receiving set 303 of the portable device 1, a keyboard 311 and a screen 312 of any known type, which are units conventionally disposed on any data processing terminal for the input and display of data. A line 313 possibly connects the terminal 302 to the server S. Another line 314 provides the electrical power supply of the terminal from the main power supply.

The receiving set 303 comprises means of optical reading constituted by a luminous source 315 for illuminating an area 316 of the screen 7 of the device 1 (a light emitting diode (LED) for example) and a photosensitive sensor 317 (a phototransistor for example), preferably directional, oriented towards this area according to a chosen direction. The luminous source can be electrically supplied from the main power supply by the line 314, through a power supply circuit 326 which also produces the power supply voltages of the other units and circuits of the terminal, voltages supplied on the output lines 327. By electrically modulating the reflectance of the area 316, as is conventionally done in order to make dark-coloured characters appear on a light background in a liquid crystal display, the quantity of light reflected by the area 316 along the axis of the optical sensor 317 is modulated, which then produces an electrical signal modulated like the reflectance of the area 316. After filtering and shaping (in a signal processing unit 318) this signal, a digital signal is available which enters the information processing means 320, a microprocessor for example, disposed in the terminal 302. The digital information thus received by the microprocessor 320 then conforms with that transmitted by the portable device 1 and transmitted by means of the liquid crystal screen 7, normally used for other purposes.

The terminal 302 also comprises means of optical transmission of information 325 working in conjunction with the means of optical reception R of the device 1. These means of optical transmission 325 are preferably constituted by several light emitting devices, such as light emitting diodes, disposed in the receiving set 303 in such a way that each of them is aligned with a phototransistor 3 of the device 1 when the latter is engaged in the receiving set 303. The light emitting devices 325 are controlled by the microprocessor 320 by means of a control circuit 324.

The information which the microprocessor 320 transmits to the device 1 can relate for example to the type of information which the microcomputer 4 of the device 1 must transfer to the terminal 302.

The microprocessor 320 supplied with the information thus received, relating to the winnings of a player, can initiate actions such as the issue at 323 of a ticket by a printer 322 incorporated in the reader, the ticket bearing information allowing the player to take advantage of these winnings, and the transmission by the light emitting devices 325 of an acknowledgement of reception in response to which the microcomputer 4 decrements the memory of the device 1 with the amount of the winnings which has been credited to the player. The information exchanges between the device 1 and the terminal 302 are preferably encoded in a way which is similar to that described previously with respect to the certification and authentication procedures.

The digital information received by the microprocessor 320 can also be formatted and conformed in an interface 321 before being injected on the line 313 in order to be transmitted to the server. This terminal 302 can therefore advantageously be used as a server terminal for the implementation of the certification and authentication procedures described previously.

This terminal allows an automatic bidirectional exchange of information, which is therefore free from the errors and delays inherent in the manual transcription of information on a keyboard by a user (which contributes to improving the reliability of the certification and authentication procedure when the terminal is used for this purpose), without this additional capability increasing the manufacturing cost price of the portable device 1, which must be as low as possible. The microcomputer 4 present in the portable object must of course be duly programmed according to a special protocol providing the control of the reflectance of the area 316 according to the information to be transmitted.

It is obvious that the embodiments described are only examples and they could be modified, in particular by the substitution of equivalent techniques, without by so doing departing from the scope of the invention.

We claim:

1. Individual and independent electronic device for participation according to a stored scenario in a broadcast program and for certification of said participation in association with a server, the electronic device comprising:
interface means for entry of at least one datum representative of a) said participation in said program and b) establishment of a certification link with said server;
first storing means for storing said participation datum and said scenario;
a clock; and
first measuring means for measuring a first relative time elapsed between a) at least a first event of said scenario, chronologically correlated with entry of said participation and b) the establishment of said certification link with the server;
the server including at least a second measuring means for measuring a second relative time elapsed between a) at least a second event of said program, chronologically correlated with an absolute deadline for entry of said participation and b) the establishment of said certification link; and
one of the electronic device and the server including comparing means for comparing the first and second relative times measured in the electronic device and the server and for conditionally certifying said participation as a function of an outcome of said comparison.

2. Device according to claim 1, wherein said first event is constituted by said entry of a participation datum in the device.

3. Device according to claim 2, wherein said second event is constituted by said absolute deadline of entry of said participation datum in the device.

4. Device according to claim 1, wherein said scenario comprises parameters representing chronological running of said program and wherein said device further comprises means of timing for implementation of said scenario according to said chronology.

5. Device according to claim 1, wherein said means of comparison are adapted for certifying said participation when there is equality, to within a given tolerance, between said first and second relative times measured in the device $\delta T_{ref}$ and in the server $\delta T_{ref}$.

6. Device according to claim 1, further comprising means of data processing for producing a result which is a function of said participation datum and said comparing means adapted to conditionally certify the said result.

7. Device according to claim 6, wherein said server comprises second storage means for storage in which said result is credited in response to said certification.

8. Device according to claim 7, further comprising means of authentication adapted for supplying to said server composite code by encoding, according to a first given algorithm as a function a) of an external control information supplied from said server and which can be encoded, said external control information comprising a random number, b) of said result and c) of an internal identification code belonging to the device stored in said first storage means, said server including means of computation for carrying out, using said random number, according to a second algorithm correlated with said first algorithm, a computation on said composite code in order to decode said result and to compute an external identification code, said result being stored in said second storage means when there is consistency between said external identification code and a check information known to the server.

9. Device according to claim 8, wherein said means of comparison are disposed in the server and said means of authentication are adapted for producing a composite code also comprising said firet relative time measured in the device for the purpose of its application to said means of comparison in said server.

10. Device according to claim 6, wherein said first storage means adapted for storing said result in response to the said certification.

11. A device according to claim 10, wherein said comparing means disposed in said server and wherein said device further comprises means of authentication comprising:
means of generating a certificate containing said first relative time measured in said device,
means of encoding said certificate,
means of transmitting said encoded certificate to said server,
means of receiving from said server, in response to said certification of said result by said means of comparison, an encoded validation code comprising a first validation key computed by said server as a function of an information known to said means of processing,
means of decoding said validation code,
means of computing a second validation key as a function of said information known to the means of processing,
means of comparing said first and second validation keys, and
means of storing said result in said first storage means when there is consistency between the first and second validation keys.

12. Device according to claim 10, wherein the comparing means disposed in the device and said device further comprises means of authentication comprising:
means of timing initialized in response to a request for validation of a result,
means of generating a message characteristic of a validation request,
means of encoding said message,
means of transmitting said encoded message to said server,
means of receiving from said server an encoded certificate comprising said second relative reference time measured by said server,
means of decoding said certificate and applying said second relative reference time to said means of comparison, and
means of storing said result in said first storage means in response to said certification by said means of comparison if the time measured by said means of timing is less than a predetermined limit duration.

13. Device according to either of claims 11 or 12, wherein said certificate or said message transmitted by device to the server comprises a secret information known to the said means of processing and wherein said validation code or said certificate transmitted from server to the device is encoded as a function of the said secret information.

14. Device according to claim 13, wherein said certificate or said message transmitted by the device to the server is encoded as a function of an information known to the server.

15. Device according to claim 1, wherein said interface means comprise a keyboard with alphabetic and/or numerical keys for the entry of data into the device.

16. Device according to claim 15, further comprising comprises means of identification adapted for comparing a code entered at the keyboard with a confidential identification code stored in said first storage means and for activating the device when there is coincidence between said codes.

17. Device according to claim 1, wherein said interface means comprise means of reception of broadcast encoded data representative of said participation scenario associated with said program.

18. Device according to claim 17, wherein said scenario data are encoded and the device further comprises means of decoding said data.

19. Device according to either of claims 17 or 18, wherein the means of reception are constituted by optical means of reading data transmitted in luminous form.

20. Device according to claim 1, wherein said interface means comprise means of displaying information stored and/or processed in the device.

21. Device according to any one of claims 8, 11 and 12, wherein said means of data processing, of comparison and authentication are constituted by a programmed microcomputer coupled to the first storage means and to said interface means.

22. Device according to claim 21, wherein said clock comprises a time base continuously supplied by an electrical power supply source and coupled to said microcomputer, said microcomputer being programmed to measure the time elapsed since the storage of a datum representative of the authorized lifetime of the device, and to inhibit the function of the device when said predetermined lifetime has expired.

23. System allowing individuals to participate, according to a predetermined scenario, in a broadcast program from a receiving set and, in association with a server, to certify by time logging participation in said program, comprising:
a) a plurality of individual and independent electronic devices for participation, each associated with an individual participating in said program, each device for participation comprising at least:
interface means for entry of at least one datum representative of said participation in said program and establishment of a certification link with said server,
first storing means for storing said participation datum and said scenario, a clock, and first measuring means for measuring a first relative time elapsed between a) at least a first event of said scenario, chronologically correlated with said entry of a participation datum in the device and b) the establishment of said certification link with the server, b) means of broadcasting said program to receiving sets, and c) at least one server fitted with first terminals for the establishment of certification links with said participation devices, said server comprising second measuring means for measuring a second relative time elapsed between a) at least a second event of said program, chronologically correlated with an absolute deadline for entry of said participation datum and b) the establishment of said certification link, d) each device and/or the server comprising comparing means for comparing the first and second relative times measured in the device and the server and for conditionally certifying said participation as a function of an outcome of said comparison.

24. System according to claim 23, wherein each device comprises data processing means for producing a result which is a function of said participation datum and the comparing means are adapted for storing said result in said second storage means in response to said certification, and wherein said system further comprises second terminals for allocating said certified results to a respective beneficiary and debiting said first storage means with said certified result in response to said allocation.

25. System according to either claims 23 or 24, wherein said interface means comprises optical reception means for reading data transmitted in luminous form.

26. System according to claim 25, wherein said terminals further comprise means of transmitting data in luminous form to said optical reception means of said participation devices.

27. System according to claim 25, wherein said receiving sets comprise a screen for the display of said program, wherein said means of broadcasting comprises means for transmitting to said receiving sets encoded scenario data displayed in luminous form on said display screens, and wherein said scenario data are readable on said display screens by said optical reception means of said participation devices.

28. System according to claim 24, wherein said second terminals further comprise means of reading information displayed in encoded form on a display screen of said participation devices.

* * * * *

UNITED STATES PATENT AND TRADEMARK OFFICE
CERTIFICATE OF CORRECTION

PATENT NO. : 5,073,931
DATED : December 17, 1991
INVENTOR(S) : Yves AUDEBERT et al.

It is certified that error appears in the above-indentified patent and that said Letters Patent is hereby corrected as shown below:

On the cover page, Item [57], line 3, "date" should read as --data--.

In Column 12, line 28, the formula

"$\delta T_{int} = T_5 - T_2$" should be -- $\delta T_{int} = T'_5 - T_2$ --.

In Column 20, in the claims, claim 5, line 63, in both occurrences, delete "$\delta T_{ref}$".

In Column 21, in the claims, claim 9, line 25, "firet" should be --first--.

Signed and Sealed this

Twenty-fifth Day of January, 1994

BRUCE LEHMAN

Attest:

Attesting Officer

Commissioner of Patents and Trademarks